US008803005B2

(12) United States Patent
Arceneaux et al.

(10) Patent No.: US 8,803,005 B2
(45) Date of Patent: Aug. 12, 2014

(54) ELECTROMAGNETIC INTERFERENCE BLOCKING CABINET WITH INTEGRATED INPUT/OUTPUT PANEL

(75) Inventors: Mario Joseph Arceneaux, Greenville, SC (US); Ashley Gates, Greenville, SC (US); John Gary Logiudice, Greenville, SC (US)

(73) Assignee: General Electric Company, Schenectady, NY (US)

( * ) Notice: Subject to any disclaimer, the term of this patent is extended or adjusted under 35 U.S.C. 154(b) by 12 days.

(21) Appl. No.: 13/557,961

(22) Filed: Jul. 25, 2012

(65) Prior Publication Data

US 2013/0277102 A1 Oct. 24, 2013

Related U.S. Application Data

(60) Provisional application No. 61/636,519, filed on Apr. 20, 2012.

(51) Int. Cl.
*H05K 9/00* (2006.01)

(52) U.S. Cl.
USPC ......... 174/382; 174/384; 361/818; 361/679.4

(58) Field of Classification Search
USPC .................. 174/382, 384; 361/818, 679.4
See application file for complete search history.

(56) References Cited

U.S. PATENT DOCUMENTS

| 5,270,493 | A |   | 12/1993 | Inoue et al. |
|-----------|---|---|---------|--------------|
| 5,592,391 | A | * | 1/1997  | Muyshondt et al. .......... 174/260 |
| 5,644,101 | A |   | 7/1997  | Elliott |
| 5,822,195 | A | * | 10/1998 | Brench et al. ................. 361/818 |
| 6,919,505 | B2 | * | 7/2005 | Cox ............................ 174/382 |
| 7,031,171 | B2 | * | 4/2006 | Marcotte et al. .............. 361/825 |
| 7,145,783 | B2 | * | 12/2006 | Chen ........................... 361/818 |

* cited by examiner

*Primary Examiner* — Hung Ngo
(74) *Attorney, Agent, or Firm* — Sutherland Asbill & Brennan LLP

(57) ABSTRACT

Certain embodiments herein are described to protect electronic equipment from electromagnetic interference (EMI). A cabinet and one or more associated input/output panels may be configured to block EMI from entering the interior of the cabinet where electronic equipment may be stored. The input/output panel may include a printed circuit board, an input/output header, and an input/output connector that may be configured to pass electronic signals transmitted via cables, for example, from one side of the input/output panel to another without accompanying EMI. Certain materials and components included on the printed circuit board may assist in deflecting or absorbing EMI so that it does not enter the cabinet. For example, one or more filters may also be mounted onto the printed circuit board to further filter out unwanted EMI.

20 Claims, 3 Drawing Sheets

ELECTROMAGNETIC INTERFERENCE BLOCKING CABINET WITH INTEGRATED INPUT/OUTPUT PANEL

RELATED APPLICATION

This application claims priority to U.S. Ser. No. 61/636,519, titled "Electromagnetic Interference Blocking Cabinet with Integrated Input/Output Panel," filed on Apr. 20, 2012, the contents of which are incorporated herein by reference.

TECHNICAL FIELD

Embodiments herein relate generally to electronics and more particularly to the protection of electronic equipment from electromagnetic interference (EMI).

BACKGROUND OF THE INVENTION

Electromagnetic interference (EMI) can cause certain electronic equipment to operate improperly or otherwise distort results that may be output by such equipment. Existing systems that are designed to prevent EMI from entering areas that store electronic equipment, such as cabinets, may be expensive, non-standardized, and slow to implement. Thus, such systems may be insufficient or unpractical to protect electronic equipment from EMI.

BRIEF DESCRIPTION OF THE INVENTION

Some or all of the above needs and/or problems may be addressed by certain embodiments of the invention. Certain embodiments may include methods and apparatuses for protecting electronic equipment. According to one embodiment, there is disclosed an input/output panel including a substrate and a signal trace encapsulated between at least two ground planes, and one or more input/output connectors configured to pass a signal from a first side of the panel to a second side of the panel, wherein the panel blocks electromagnetic interference (EMI) from passing from the first side of the panel to the second side of the panel.

According to another embodiment, there is disclosed a cabinet including one or more EMI blocking walls, an EMI blocking door, and input/output panels attached to the EMI blocking doors and/or walls. The input/output panels include a substrate and a signal traces encapsulated between at least two ground planes, and one or more input/output connectors configured to pass a signal from a first side of the input/output panel to a second side of the input/output panel, wherein the panel blocks EMI from passing from the first side of the input/output panel to the second side of the input/output panel.

According to a further embodiment, there is disclosed a method including mounting an input/output panel to an EMI blocking cabinet, wherein the input/output panel includes a substrate and a signal trace encapsulated between at least one ground plane, and one or more input/output connectors configured to pass a signal from a first side of the input/output panel to a second side of the input/output panel, wherein the panel blocks EMI from passing from the first side of the input/output panel to the second side of the input/output panel.

BRIEF DESCRIPTION OF THE FIGURES

The detailed description is set forth with reference to the accompanying drawings, which are not necessarily drawn to scale. The use of the same reference numbers in different figures indicates similar or identical items.

DETAILED DESCRIPTION OF THE INVENTION

Figure 1:
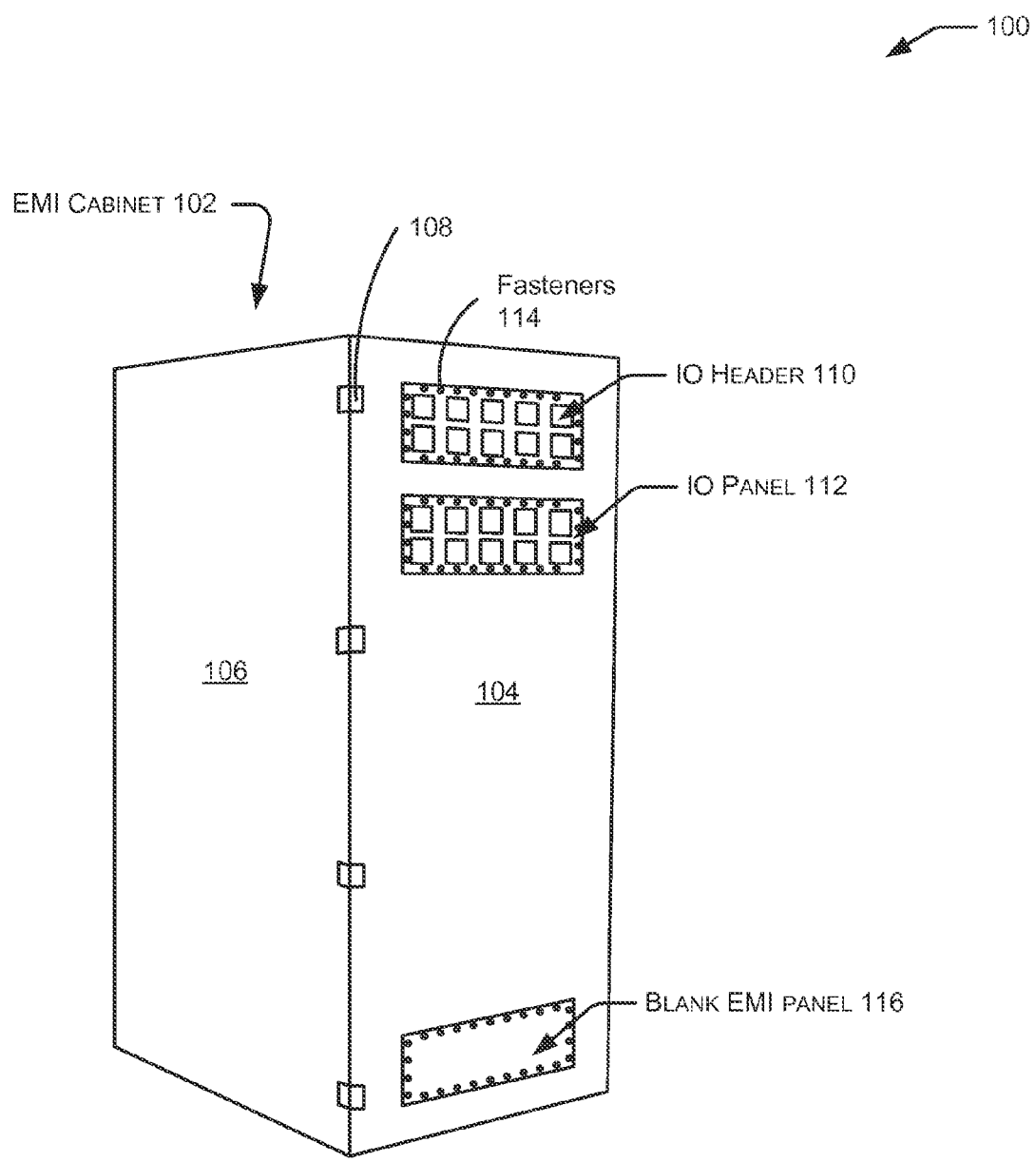
FIG. 1 is a perspective view of a cabinet configured to protect electronic equipment from EMI, according to one embodiment.

Illustrative embodiments will now be described more fully hereinafter with reference to the accompanying drawings, in which some, but not all embodiments of the invention are shown. The invention may be embodied in many different forms and should not be construed as limited to the embodiments set forth herein; rather, these embodiments are provided so that this disclosure will satisfy applicable legal requirements.

Illustrative embodiments of the invention are directed to, among other things, the protection of electronic equipment from electromagnetic interference (EMI). Electronic equipment as used herein can refer to equipment or devices that include electrical components that may provide the controlled conduction of electrons. Electronic equipment may receive and process electronic signals and, for example, provide certain outputs commensurate with the function provided by the equipment. The electronic signals may be delivered to the electronic equipment by one or more cables carrying the signals and corresponding EMI. The EMI may cause electronic equipment to operate improperly, particularly electronic equipment that may be highly sensitive to EMI, such as certain measurement equipment. Certain embodiments herein are directed to protecting electronic equipment from such EMI by blocking at least a portion of the EMI from interfering with the electronic equipment. Protecting electronic equipment, preventing/blocking EMI from entering a cabinet, or similar language used herein can generally mean blocking an amount of EMI that is sufficient to protect the operability of electronic equipment.

A cabinet, e.g., an EMI cabinet, can be configured to protect electronic equipment housed within the cabinet from EMI. For example, according to one embodiment, input/output (IO) panels can be mounted or attached to the cabinet and can include IO connectors that can receive cables, wires, and their corresponding signals. The IO connectors can be configured to pass the signals from a first side of the IO panel to a second side of the IO panel. In certain embodiments, the IO panels can include, but are not limited to, printed circuit boards (PCBs). A PCB can include, but is not limited to, one or more materials on each side of the PCB that may deflect or absorb EMI so that it may not reach electronic equipment in the EMI cabinet. One or more filters may also be included on a PCB to further filter out EMI before it enters the EMI cabinet. Additionally or alternatively, one or more EMI gaskets may electrically connect an IO panel to a surface of the EMI cabinet to facilitate conducting deflected or absorbed EMI away from electronic equipment to electrical ground. The above configuration may also include certain other components that may be mounted to a PCB, such as active signal conditioning components that may be used to perform various functions associated with the electronic equipment in the EMI cabinet.

The technical effects of certain embodiments disclosed herein may include a cabinet for blocking EMI that is cost-effective, standard, and scalable in the way that additional cables and corresponding signals may be added to a cabinet that may have been previously configured to block EMI.

FIG. 1 depicts a cabinet 100 that includes an EMI cabinet 102 configured to protect electronic equipment from EMI, according to one embodiment. As shown in FIG. 1, the EMI cabinet 102 can include a front face 104, a left side face 106, and other faces or surfaces not shown, including a right side face, a rear face, a top face, and a bottom face. The edges of each of these faces or walls may be joined to form a cube-shaped enclosure for housing electronic equipment or other contents. According to various embodiments, the edges may be joined via welding, hinges, and/or another attachment mechanism that is sufficient to join the edges to create the enclosure. For example, one or more hinges 108 may be used to join the front face 104 to the left side face 106. According to this example, the front face 104 may include, but is not limited to, a door (e.g., a front door 104) that rotates about the hinges to open and close, and EMI gasket material to seal the door to the front or rear face of the EMI cabinet 102. The rear face may also include, but is not limited to, a door (e.g., a rear door) that also rotates about hinges to open and close in similar fashion to the front door 104. In certain embodiments, the faces or doors of the EMI cabinet may be sheet metal, metal screen, metal foam, or various other materials that may block at least a portion of EMI from entering the enclosure, i.e., blocking doors, blocking panels, and blocking walls.

FIG. 1 also depicts IO headers 110, an IO panel 112, and a blank EMI panel 116 for expansion and growth. In one embodiment, one or more portions of a front door 104 may be cut away or otherwise removed to create one or more openings (not shown) in the EMI cabinet 102. The openings may enable cables, wires, and corresponding signals, for example, to enter the interior area of the EMI cabinet 102. One or more of the IO panels 112 may be attached to the front door 104 such that the openings may be at least partially covered. For example, in one embodiment, the IO panel 112 may completely cover an opening, such as in FIG. 1 where an opening is hidden from view behind IO panel 112. The IO panel 112 can facilitate the entry of cables, wires, and corresponding signals into the EMI cabinet 102. Fasteners 114 can be used to attach and secure the IO panel 112 to the EMI cabinet 102.

Figure 2:
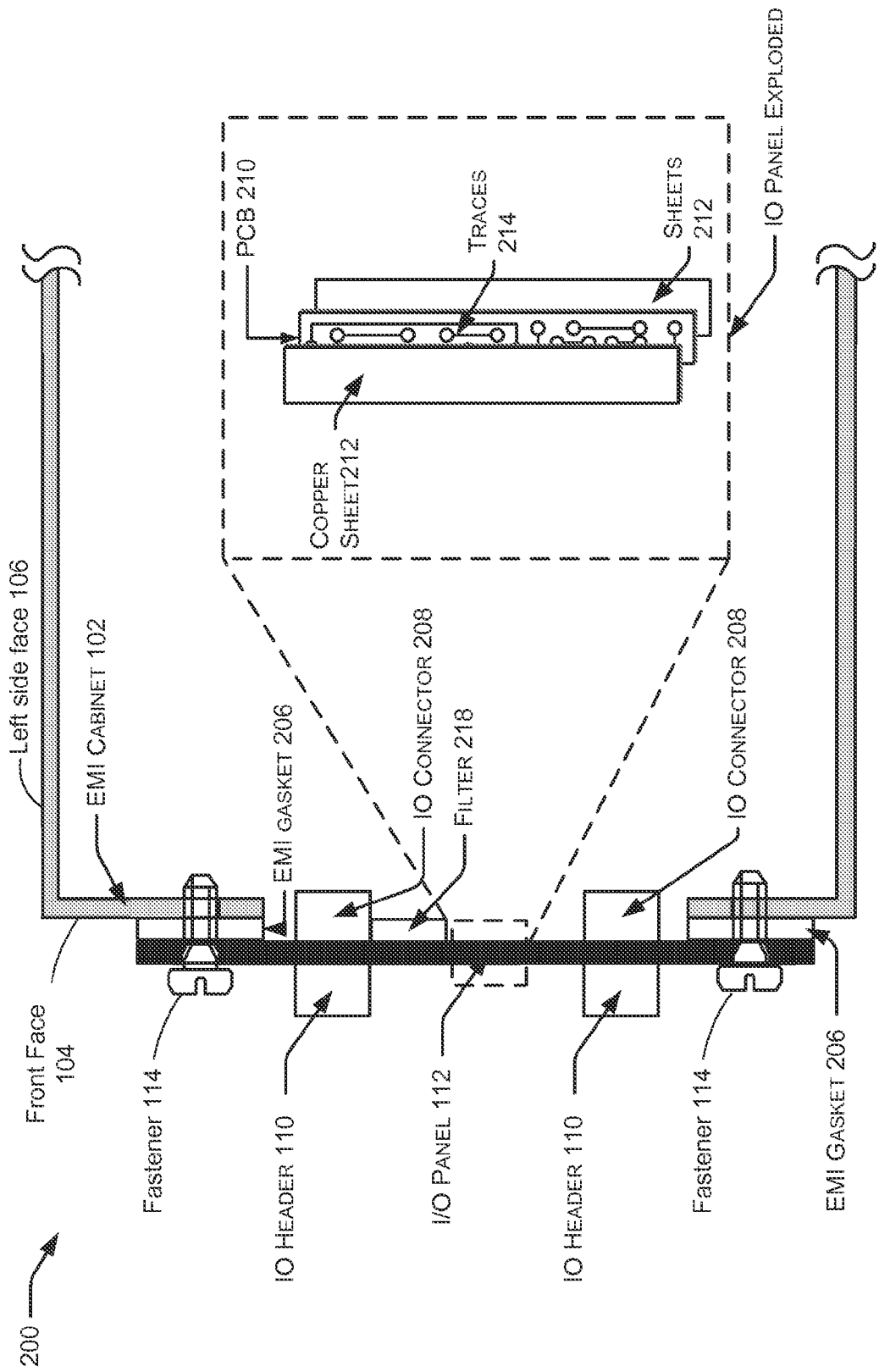
FIG. 2 illustrates a cross-section of an exemplary cabinet configured to protect electronic equipment from EMI, according to one embodiment.

FIG. 2 depicts an exemplary cabinet configuration 200 of an EMI cabinet 102 that may protect electronic equipment from EMI. Along with the EMI cabinet 102, the IO panel 112 may also be configured to block EMI. The IO panel 112 may include, but is not limited to, a first side and a second side. As used herein, the first side of the IO panel 112 may refer to the surface of the IO panel 112 that faces opposite the interior area of the EMI cabinet 102 where electronic equipment may be stored. The second side of the IO panel 112 may face toward the interior area.

In one aspect of an embodiment, the IO panel 112 may include, but is not limited to, a substrate such as a single or multilayer printed circuit board (PCB) 210. PCB 210 may include one or more signal traces 214, which can be referred to as conductive pathways that electrically connect electronic components on a substrate. In one aspect of an embodiment, the signal traces 214 may include etched copper, and the PCB 210 may also include a non-conductive material. The signal traces 214 and PCB 210 may be encapsulated between at least two ground planes, such as the sheets 212. In one aspect of an embodiment, the ground planes may include, but are not limited to, one or more of a copper material, an aluminum material, a nickel material, a steel material, a mu-metal material, an electro-magnetic sensitive metal, or other materials that may prevent EMI from passing through the PCB 210 while allowing signals to enter the EMI cabinet 102, according to various embodiments. The ground planes, e.g., sheets 212, may also include component through-holes. Such component through-holes may be much smaller than the maximum frequency wavelength of the PCB 210, according to one embodiment.

EMI may be prevented from passing through the PCB 210, and hence the IO panel 112 in one embodiment, at least in part by virtue of the size and thickness of the sheets 212. For example, for EMI frequencies below about 100 MHz, the size of the PCB 210, which may correspond to the size of the opening in the EMI cabinet 102, may be such that EMI waves may be deflected off of the IO panel 112. For EMI frequencies above about 100 MHz, the sheets 212 may have a thickness that is sufficient to conduct or absorb EMI waves into the surface of the EMI cabinet 102, where various other components that will be discussed in greater detail may facilitate conducting the waves to electrical ground. In one embodiment, IO panel 112 may have a maximum frequency wavelength of about 1 GHz, a thickness of about 0.125 inches, and have 4U standard size filler panel dimensions. In another embodiment, the IO panel 112 may include, but is not limited to one or more of copper cladding, mu-metal, nickel-copper-silver alloy, annealed copper, or other EMI shielding laminates that may be added to the surface of the IO panel 112. In one aspect of an embodiment, a thickness of the copper cladding may be based at least in part on the EMI wavelength. IO panels 112 of various sizes, thicknesses, and EMI blocking materials may be used in other embodiments.

In one embodiment, one or more IO connectors 208 and IO headers 110 may be connected to the IO panel 112. According to an exemplary configuration, the IO header 110 may be mounted to the first side of the IO panel 112, while the IO connector 208 may be mounted to the second side of the IO panel 112. In other embodiments, the IO header 110 may be mounted to the second side, while the IO connector 208 may be mounted to the first side. The IO header 110 and the IO connector 208 may have male or female pin connectors that may be configured to receive a cable, wires, and corresponding signals. For example, in one embodiment, a cable can be introduced into the EMI cabinet 102 via its connection to the IO header 110, and signals transmitted through the cable may be carried into the EMI cabinet 102 to electronic equipment via a cable connected to the IO connector 208. As noted above, radiated EMI associated with the signals can be deflected or absorbed by the sheets 212 and conducted through the surface of the EMI cabinet 102 to electrical ground. Conducted EMI associated with the signals can be filtered and conditioned by the electronic components 218 mounted as shown in FIG. 2, in one embodiment. In this way, signals may reach electronic equipment in the EMI cabinet 102 without accompanying EMI. Although two IO headers 110 and two IO connectors 208 are shown in FIG. 2, fewer or more of them may exist in other embodiments. Similarly, although one IO panel 112 is shown, more may exist. In certain embodiments, PCB 210 may embody the panel 112.

The technical effects of certain embodiments herein may include, but are not limited to, the use of printed circuit boards to act as an electrical interface and a shield against EMI. Thus, as noted, with each desire to transmit signals to electronic equipment in the EMI cabinet 102, EMI may be prevented from entering the EMI cabinet 102 upon connecting one or more cables carrying the signals to the IO panel 112.

FIG. 2 also depicts a filter 218, which may be used to filter out EMI that may be flowing through cables carrying signals into the EMI cabinet 102. In one aspect of an embodiment, the IO panel 112 may include an adjustable EMI filter mounted on the second side of the IO panel 112. Although one filter 218 is shown in FIG. 2, more filters 218 may exist in other embodiments. For example, in certain of these other embodiments, the EMI filter 218 may include, but is not limited to, a low-pass filter. The low-pass filter may include at least one of a capacitor, resistor, and/or an inductor, in certain aspects of an embodiment. Filters 218 can also be low-pass, single-pole or multi-pole filters that are associated with each signal pin of an IO connector 208, for example, such that each signal path entering the EMI cabinet 102 may be filtered to prevent EMI from entering into the EMI cabinet 102. Active signaling conditioning components may also be mounted to the IO panel 112, in some embodiments. Other components or circuits that may be required by the electronic equipment in the EMI cabinet 102 may also be mounted to the IO panel 112 in other embodiments.

As noted above, fasteners 114 may attach the IO panel 112 to the EMI cabinet 102. Fasteners 114 may also attach an EMI gasket 206 to the EMI cabinet 102 such that the EMI gasket 206 is secured between the IO panel 112 and the EMI cabinet 102, as shown in FIG. 2. The spacing between fasteners 114 can be minimized to meet or exceed the EMI frequency blocking rating of the cabinet. The EMI gasket 206 may be used to electrically connect the IO panel 112 to the EMI cabinet 102. The electrical connection provided by the EMI gasket 206 may facilitate the conduction of EMI away from electronic equipment or other contents within the EMI cabinet 102 and instead through the skin or surface of the EMI cabinet 102 to a ground rod (not shown), which may be used to ground the EMI cabinet 102, according to one embodiment. The EMI gasket 206 may be sized such that it attaches to approximately the portion of the IO panel 112 that overlaps a corresponding opening in the EMI cabinet 102. In other embodiments, EMI gaskets of various sizes, shapes, types, and materials may be used, as well as other components that may provide conductive pathways to electrical ground.

As used herein, the term fastener may include various types of screws, bolts, pins, accompanying washers and nuts, other hardware components, welds, or other components or substances that can be used to attach surfaces described in certain embodiments herein. Thus, while a hardware component, i.e., fastener 114, is illustrated in FIG. 2, substances such as tape, glue, and other adhesives may also be used as attachment mechanisms. In some embodiments, the attachment mechanism may have properties that allow them to more easily conduct EMI to ground, while such properties may not exist for attachment mechanisms in other embodiments.

Figure 3:
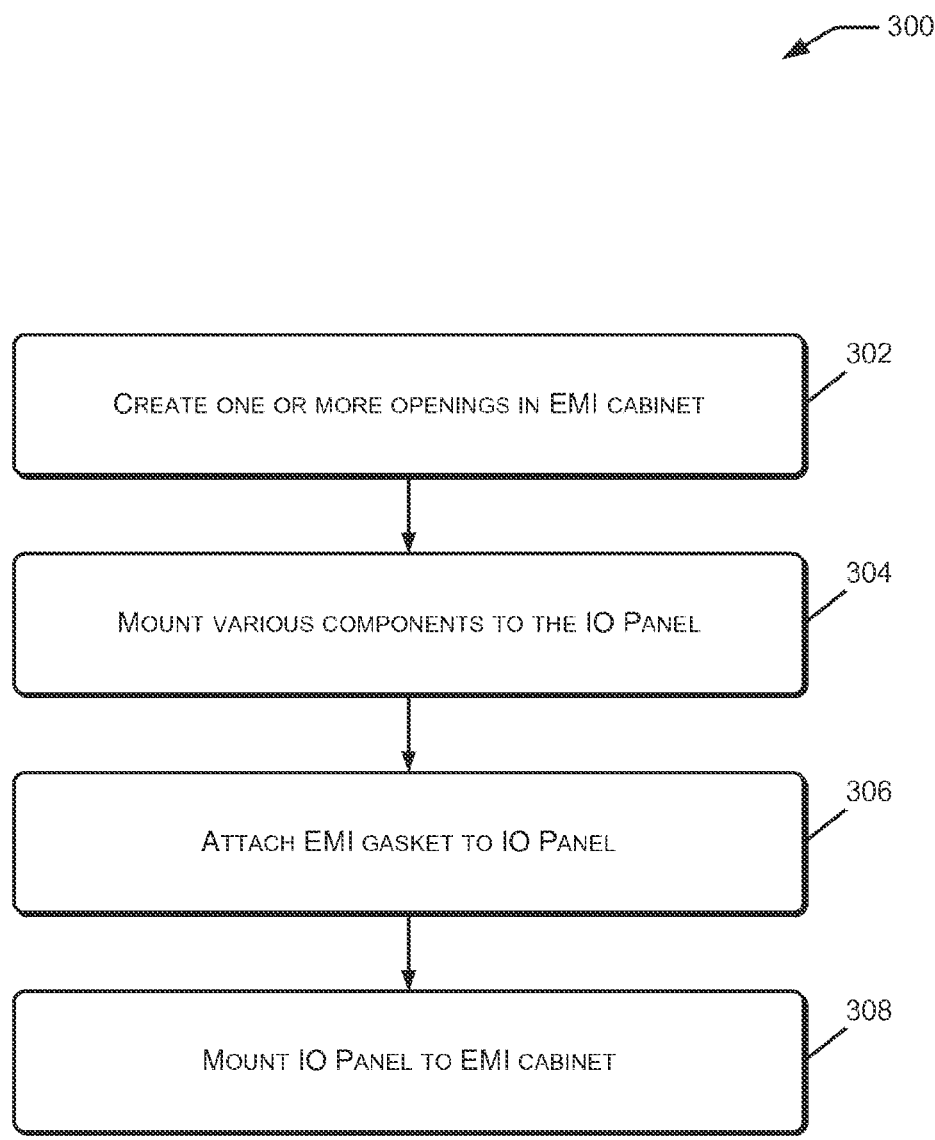
FIG. 3 is a flow diagram illustrating details of a method for configuring a cabinet to protect electronic equipment from EMI, according to one embodiment.

FIG. 3 is an exemplary flow diagram 300 for constructing a cabinet 200, according to one embodiment. The construction may begin at block 302 where one or more openings in the cabinet, e.g., EMI cabinet 102, may be created. As noted above, such openings may be created by cutting away or removing at least a portion of the cabinet. In an exemplary embodiment, the opening is about the same size as an IO panel, e.g., IO panel 112.

Various components may be mounted to the IO panel at block 304. Such components may include, but are not limited to, an IO header (e.g., IO header 110), an IO connector (e.g., IO connector 208), a filter (e.g., filter 218), and active power and signaling conditioning components, which can be substituted for or used in addition to the filter 218, in certain embodiments. As noted above, the IO panel may include, but is not limited to, a printed circuit board to which each of these components may be connected to facilitate the transmission of signals while blocking EMI. In one embodiment, the components may be soldered to the printed circuit board.

A gasket, such as an EMI gasket 206, may be attached to the IO panel via a fastener, e.g., fastener 114, at block 306. The gasket may be attached to the panel along the perimeter of the IO panel, in one embodiment. Thus, according to one embodiment, fasteners can secure an IO panel and a gasket to a cabinet such as the EMI cabinet 102, at block 308.

While certain embodiments of the invention have been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the invention and also to enable any person skilled in the art to practice certain embodiments of the invention, including, but not limited to, making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

That which is claimed:

1. An input/output panel, comprising:
   a substrate and a signal trace encapsulated between at least two ground planes; and
   one or more input/output connectors configured to pass a signal from a first side of the input/output panel to a second side of the input/output panel, wherein the substrate is configured to deflect at least a portion of electromagnetic interference (EMI) associated with the signal onto the at least two ground planes to allow the signal to pass from the first side to the second side without the EMI, wherein the second side faces an interior of a cabinet adjacent to the input/output panel.

2. The input/output panel of claim 1, wherein the substrate comprises a non-conductive material.

3. The input/output panel of claim 1, wherein the signal trace comprises etched copper.

4. The input/output panel of claim 1, wherein the at least two ground planes are comprised of at least one of a copper material, an aluminum material, a nickel material, a steel material, a mu-metal material, or an electro-magnetic sensitive metal.

5. The input/output panel of claim 1, wherein the at least two ground planes comprise component through-holes.

6. The input/output panel of claim 1, further comprising an EMI filter mounted on the second side of the input/output panel.

7. The input/output panel of claim 6, wherein the EMI filter comprises a low-pass filter.

8. The input/output panel of claim 7, wherein the low-pass filter comprises at least one of a capacitor, a resistor, or an inductor.

9. A cabinet, comprising:
   one or more electromagnetic interference (EMI) blocking walls;
   one or more EMI blocking doors; and an input/output panel attached to at least one of the one or more EMI blocking doors or the one or more EMI blocking walls, wherein the input/output panel comprises:
  a substrate and a signal trace encapsulated between at least two ground planes; and
  one or more input/output connectors configured to pass a signal from a first side of the input/output panel to a second side of the input/output panel, wherein the substrate is configured to deflect at least a portion of EMI associated with the signal onto the at least two ground planes to allow the signal to pass from the first side to the second side without the EMI, wherein the second side faces an interior of the cabinet.

10. The cabinet of claim 9, wherein the substrate of the input/output panel comprises a non-conductive material.

11. The cabinet of claim 9, wherein the signal trace of the input/output panel comprises etched copper.

12. The cabinet of claim 9, wherein the at least two ground planes of the input/output panel are comprised of at least one of a copper material, an aluminum material, a nickel material, a steel material, a mu-metal material, or an electro-magnetic sensitive metal.

13. The cabinet of claim 9, wherein the at least two ground planes of the input/output panel comprise component through-holes.

14. The cabinet of claim 9, wherein the input/output panel comprises at least copper cladding, wherein a thickness of the copper cladding is based at least in part on an EMI wavelength.

15. The cabinet of claim 9, further comprising an EMI filter mounted on the second side of the input/output panel.

16. The cabinet of claim 15, wherein the EMI filter comprises a low-pass filter.

17. The cabinet of claim 16, wherein the low-pass filter comprises at least one of a capacitor, a resistor, or an inductor.

18. A method, comprising:
  mounting an input/output panel to an electromagnetic interference (EMI) blocking cabinet, wherein the input/output panel comprises:
    a substrate and a signal trace encapsulated between at least two ground planes; and
    one or more input/output connectors configured to pass a signal from a first side of the input/output panel to a second side of the input/output panel, wherein the substrate is configured to deflect at least a portion of EMI associated with the signal onto the at least two ground planes to allow the signal to pass from the first side to the second side without the EMI, wherein the second side faces an interior of the cabinet.

19. The method of claim 18, wherein the input/output panel comprises a printed circuit board (PCB) comprising at least copper cladding, wherein a thickness of the copper cladding is based at least in part on an EMI wavelength.

20. The method of claim 18, further comprising mounting an EMI filter to the second side of the input/output panel.

* * * * *